United States Patent
Makkar

(10) Patent No.: US 12,405,305 B2
(45) Date of Patent: Sep. 2, 2025

(54) RESET FOR SCAN MODE EXIT FOR DEVICES WITH POWER-ON RESET GENERATION CIRCUITRY

(71) Applicant: STMicroelectronics International N.V., Geneva (CH)

(72) Inventor: Shikhar Makkar, Faridabad (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/612,251

(22) Filed: Mar. 21, 2024

(65) Prior Publication Data

US 2024/0319270 A1    Sep. 26, 2024

Related U.S. Application Data

(60) Provisional application No. 63/453,904, filed on Mar. 22, 2023.

(51) Int. Cl.
*G01R 31/3177* (2006.01)
*G01R 31/317* (2006.01)
*G01R 31/3185* (2006.01)

(52) U.S. Cl.
CPC ... *G01R 31/3177* (2013.01); *G01R 31/31701* (2013.01); *G01R 31/318544* (2013.01); *G01R 31/318555* (2013.01)

(58) Field of Classification Search
CPC .......... G01R 31/3177; G01R 31/31701; G01R 31/318544; G01R 31/318555; G01R 31/31853
USPC ........................................ 714/726, 727, 729
See application file for complete search history.

(56) References Cited

U.S. PATENT DOCUMENTS

| | | | | |
|---|---|---|---|---|
| 6,378,093 B1* | 4/2002 | Whetsel | ......... | G01R 31/318555 714/726 |
| 6,405,335 B1* | 6/2002 | Whetsel | ......... | G01R 31/318558 714/729 |
| 9,213,063 B2* | 12/2015 | Jindal | ............ | G01R 31/318583 |
| 10,955,473 B1 | 3/2021 | Jain et al. | | |
| 2002/0147950 A1* | 10/2002 | Whetsel | ......... | G01R 31/318575 714/726 |
| 2004/0111658 A1 | 6/2004 | Natsume | | |
| 2006/0164072 A1* | 7/2006 | Ng | ..................... | G01R 31/2812 324/762.02 |
| 2007/0236265 A1 | 10/2007 | Maeda | | |

(Continued)

OTHER PUBLICATIONS

"Robust Asynchronous-Reset Architecture for Scan Coverage," EDN, www.edn.com; Apr. 15, 2015, 13 pgs.

(Continued)

*Primary Examiner* — John J Tabone, Jr.
(74) *Attorney, Agent, or Firm* — Crowe & Dunlevy LLC

(57) ABSTRACT

A system for performing scan testing on a device core uses a test access port (TAP). The TAP includes a test clock (TCK) pin, a test data in (TDI) pin, and a test mode select (TMS) pin, along with a test control register (TCR) associated with it. The TCR is used to set a scan mode signal, which configures the scan flip flops within the device core for scan testing and performs the scan testing on the device core. The TCR can also be reset to exit the scan testing, with the reset being triggered by a reset circuit receiving the deassertion of both a scan enable (SE) signal and a scan input (SI) signal during the capture-phase of scan testing.

20 Claims, 3 Drawing Sheets

(56) References Cited

U.S. PATENT DOCUMENTS

| | | | |
|---|---|---|---|
| 2012/0062283 A1 | 3/2012 | Kwan et al. | |
| 2015/0186238 A1* | 7/2015 | Lowe | G06F 11/348 |
| | | | 714/30 |
| 2015/0276866 A1* | 10/2015 | Jindal | G01R 31/318583 |
| | | | 714/727 |
| 2018/0096656 A1 | 4/2018 | Lee et al. | |
| 2024/0319270 A1* | 9/2024 | Makkar | G01R 31/3177 |

OTHER PUBLICATIONS

"Successful Implementation of Scan-Based Design-for-Test," Electronic Design, Sep. 1, 1996, 8 pgs.

"RT600—Dual-core microcontroller with 32-bit Cortex(r)-M33 and Xtensa HiFi4 Audio DSP CPUs . . . ," Product Data Sheet, NXP Semiconductors, Mar. 3, 2020, 149 pgs.

* cited by examiner

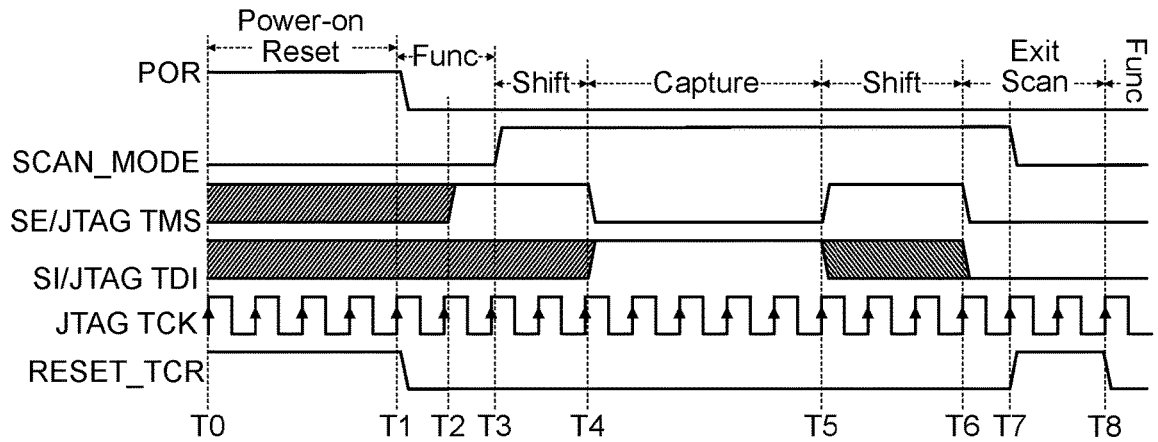
FIG. 3
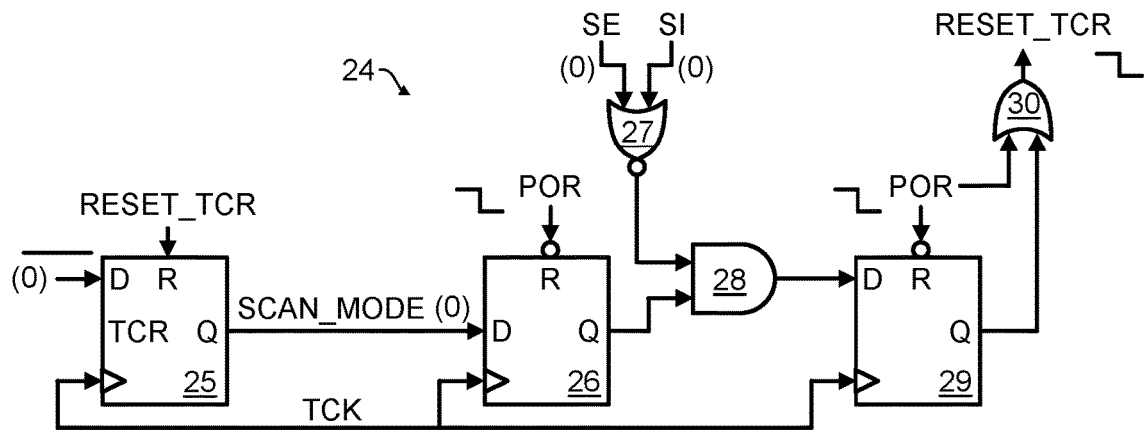
FIG. 4 -- Functional Mode Operation
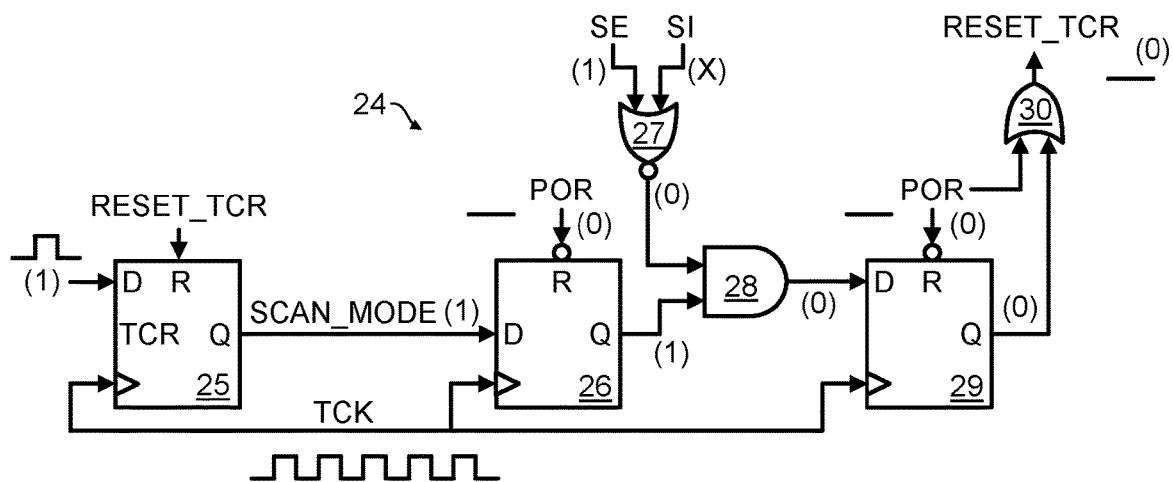
FIG. 5 -- Shift Phase of Scan Mode

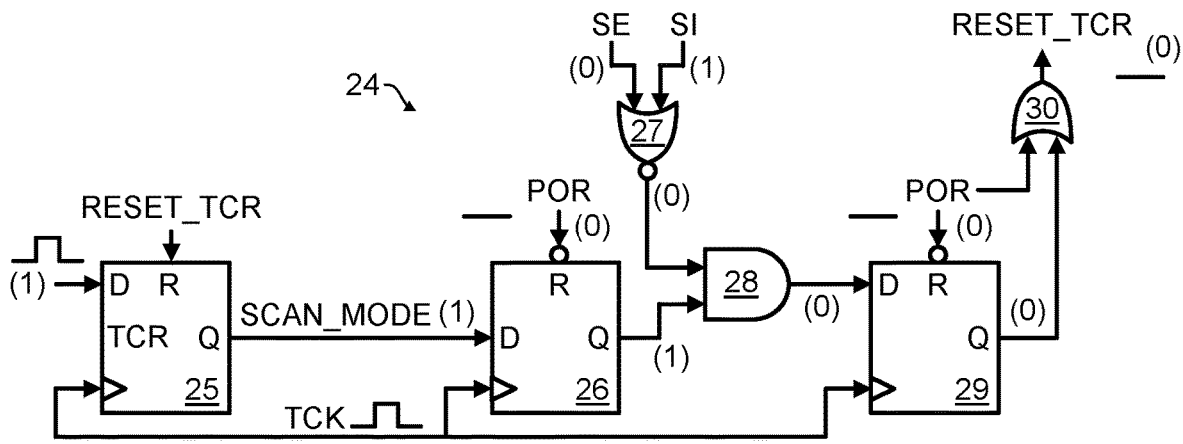
FIG. 6 -- Capture Phase of Scan Mode
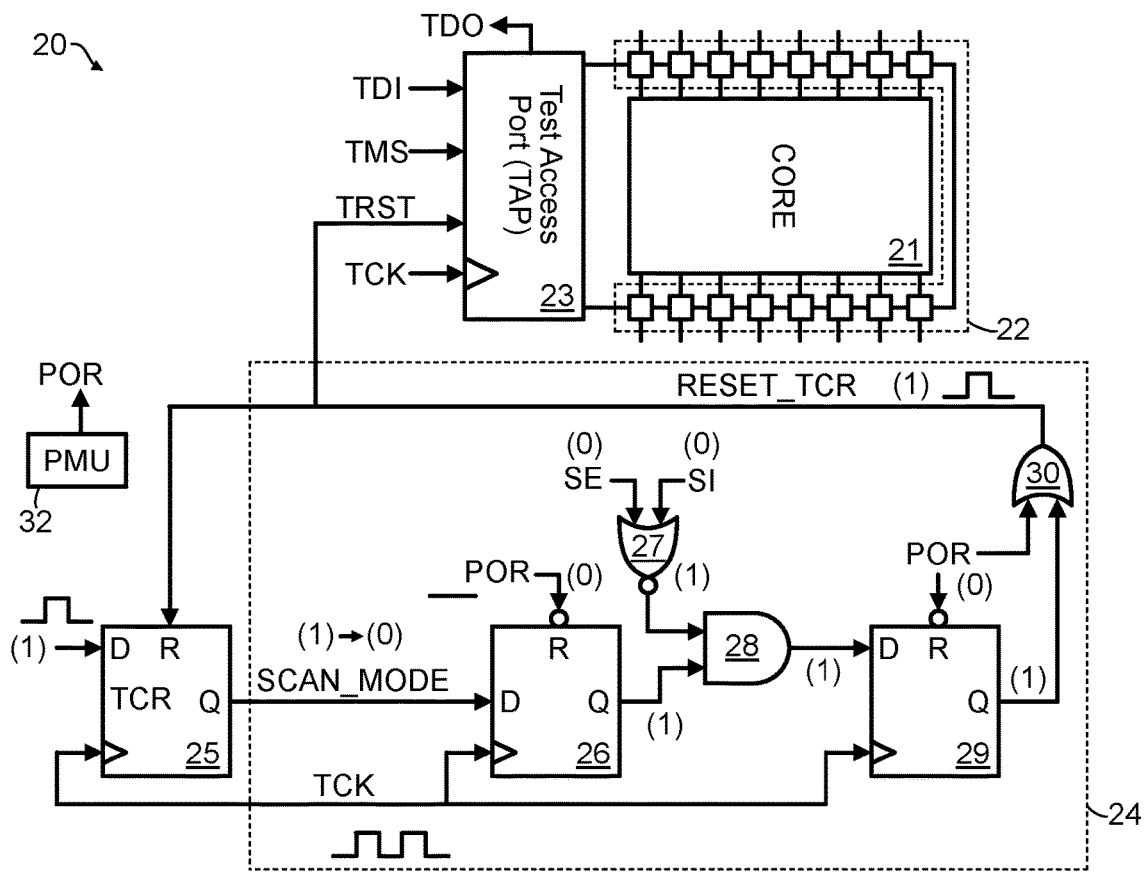
FIG. 7 -- Exiting Scan Mode

RESET FOR SCAN MODE EXIT FOR DEVICES WITH POWER-ON RESET GENERATION CIRCUITRY

RELATED APPLICATION

This application claims priority to United States Provisional Application for Patent No. 63/453,904, filed Mar. 22, 2023, the contents of which are incorporated by reference in their entirety.

TECHNICAL FIELD

This disclosure is related to the field of structural testing using automated test pattern generation (ATPG) patterns of system on chips (SoCs) which incorporate a Joint Test Action Group (JTAG) Test Access Port (TAP), and in particular, to a reset circuit providing a JTAG TAP with the ability to exit scan test mode.

BACKGROUND

Referring now to FIG. 1, a device 10, such as a system-on-a-chip (SOC) including a device core 11 and a JTAG TAP 13 for facilitating testing of the device core 11 is shown. Scan testing is a method of testing the digital integrated circuits within the device core 11, utilizing the TAP 13 to control a circuit under test within the device core 11. The JTAG TAP is utilized to configure the core 11 to enter into scan mode where the pins TDI, TMS and TCK are used to program the Test Control Registers (TCRs). Once the core 11 is configured for scan mode, the TDI, TMS, TDO and TCK pins are re-used for scan testing by using them as the scan data input (SDI) pin, scan enable (SE) pin, scan data output (SDO) pin and shift clk pin. The core is scan tested by applying test vectors using the test data input (TDI) pin and then observing the response of the circuit under test to the applied test vectors on the test data output (TDO) pin. The circuit under test can include functional blocks which serve different functionalities.

In greater detail, to perform scan testing utilizing the TAP 13, the different flip flops in the device core 11 are connected in a shift register configuration through their scan data input (SDI) pins to form scan chains. The scan testing itself includes a shift phase during which the test vector is applied to the scan chains through the SDI pin and the response of the circuit under test to the previous test vector is shifted out through the corresponding SDO pin. The scan testing further includes a capture phase during which the flip flops of the scan chain capture the response by the circuit under test to the applied test vector. This response is shifted out through the SDO pin during the next shift phase during which a corresponding next test vector is to be applied.

A control signal utilized in making a mode transition from the shift phase to the capture phase and vice versa is the scan enable (SE) signal. When the scan enable SE signal is high, the flip flops of the scan chain function as a shift register. When the scan enable SE signal is low, the flip flops of the scan chain function as normal flip flops. To improve the test coverage of the device core 11, it is desirable for its complete logic to become part of the scan chains.

The device 10 also incorporates standard test protocols, such as Joint Test Action Group (JTAG), which enable the testing of interconnects between different chips embedded on a board as per the IEEE 1149.1 protocol.

To enter scan test mode from functional mode, special flip flops within the device 10 called Test Control Registers (TCRs) are to be programmed. The JTAG protocol is a simple, widely used protocol to program these TCRs. Once the scan test mode bit within the corresponding TCR is programmed to a logic high, the JTAG TAP is made part of the scan chains and it can no longer be controlled externally using the set of input pins as specified by the IEEE 1149.1 protocol (e.g., the TDI pin, a test clock TCK pin, and a test mode select TMS pin).

To exit the scan mode, it is necessary to re-program the TCRs. Because the JTAG TAP is no longer externally controllable during scan mode, the TCRs cannot be reprogrammed. Therefore, either a power-on reset (POR) is required to be performed by power cycling the device, or a dedicated pin is required to be present to reset the TCRs. Power cycling the device leads to an increase in the test time and, therefore, test cost. Resetting the TCRs using an external pin also causes an increase in the test cost because of reduced tester (automated test equipment—ATE) bandwidth.

Therefore, further development is needed.

SUMMARY

Disclosed herein is a system including a device core and associated scan flip flops.

A test access port (TAP) is coupled to the scan flip flops, the TAP having a test clock (TCK) pin receiving a test clock (TCK) signal that clocks the TAP, a test data in (TDI) pin receiving a test data in (TDI) signal, and a test mode select (TMS) pin receiving a test mode select (TMS) signal. A test control register (TCR) is associated with the TAP. The TAP, in response to setting of the TCR to assert a scan mode signal, configures the scan flip flops for scan testing and performs the scan testing on the device core. The TAP, in response to resetting of the TCR to deassert the scan mode signal, exits the scan testing. A reset circuit resets the TCR in response to deassertion of both a scan enable (SE) signal applied to the TMS pin and a scan input (SI) signal applied to the TDI pin during a capture-phase of scan testing.

The reset circuit may reset the TCR by asserting a TCR reset signal. The TAP may include test reset (TRST) pin coupled to receive the TCR reset signal, with the TAP being further configured to reset based upon assertion of the TCR reset signal.

The reset circuit may include a first flip flop having a data input coupled to receive the scan mode signal, a reset input coupled to receive a power-on reset signal, and an output. A first logic circuit may generate a first logic output based upon the SE signal, SI signal, and the output of the first flip flop. A second flip flop may have a data input coupled to receive the first logic output, a reset input coupled to receive the power-on reset signal, and an output. A second logic circuit may be configured to cause reset of the TCR based upon the output of the second flip flop and the power-on reset signal.

The first logic circuit may include a NOR gate having inputs coupled to receive the SE signal and SI signal as input and an AND gate having inputs coupled to receive an output of the NOR gate and the output of the first flip flop.

The second logic circuit may include an OR gate having inputs coupled to receive the output of the second flip flop and the power-on reset signal. The OR gate may generate a TCR reset signal based upon a logical OR operation between its inputs, and may have an output coupled to a reset input of the TCR.

The TAP may include test reset (TRST) pin coupled to receive the TCR reset signal from the OR gate. The TAP may be further configured to reset based upon assertion of the TCR reset signal.

Also disclosed herein is a method of testing a device using a joint test action group (JTAG) test access port (TAP) connected to the device. The method may include performing a power-on-reset of the device by asserting a power-on reset (POR) signal provided to the TAP, resetting a reset circuit in response to assertion of the POR signal, resetting a test control register (TCR) in response to assertion of the POR signal, and exiting power-on-reset by deasserting the POR signal. The method may further include setting the TCR to assert a scan mode signal in response to exit of the power-on-reset, asserting a scan enable signal connected to the TAP to cause entry of the device into a shift-phase of a scan mode, performing the shift-phase of a scan test in the scan mode, and deasserting the scan enable signal and asserting a scan in signal to exit the shift-phase of the scan mode and enter a capture-phase of the scan mode. The method may additionally include pulsing the shift clock and performing the capture-phase of the scan test in the scan mode, exiting the scan mode by deasserting the scan enable signal and a scan in signal and pulsing the shift clock signal to thereby cause assertion of a TCR reset signal, and resetting the TCR in response to assertion of the TCR reset signal.

The assertion of the TCR reset signal may be caused in response to deassertion of the scan enable signal and the scan in signal by clocking a first flip flop receiving the scan mode signal, performing a logical NOR operation between the scan enable signal and the scan in signal, performing a logical AND operation between an output of the first flip flop and a result of the logical NOR operation, clocking a second flip flop receiving a result of the logical AND operation, and performing a logical OR operation between the POR signal and an output of the second flip flop. A result of the logical OR operation may be the TCR reset signal.

Also disclosed herein is an electronic device including a device core and associated scan flip flops. A test access port (TAP) is coupled to the scan flip flops, the TAP having a test clock (TCK) pin receiving a test clock (TCK) signal that clocks the TAP, a test data in (TDI) pin receiving a test data in (TDI) signal, a test mode select (TMS) pin receiving a test mode select (TMS) signal. A test control register (TCR) is associated with the TAP, the TCR having a data input, a reset input connected to receive a TCR reset signal, and a data output. A first flip flop has a data input connected to the data output of the TCR, a reset input connected to receive a power-on reset (POR) signal, and a data output. A first logic circuit generates a first logic output based upon signals at the TMS and TDI pins and the data output of the first flip flop. A second flip flop has a data input coupled to receive the first logic output, a reset input coupled to receive the power-on reset signal, and a data output. A second logic circuit is configured to assert the TCR reset signal based upon a logical OR operation performed on the data output of the second flip flop.

The first logic circuit may include a NOR gate having its inputs connected to the TMS and TDI pins, and an AND gate having its inputs connected to an output of the NOR gate and the data output of the first flip flop, wherein the first logic output is generated at an output of the AND gate. The second logic circuit may include an OR gate having its input connected to the data output of the second flip flop and the POR signal, wherein the TCR reset signal is generated at an output of the OR gate. The TAP may include a test reset (TRST) pin coupled to receive the TCR reset signal, with the TAP being further configured to reset based upon assertion of the TCR reset signal.

Also disclosed herein is a system for testing an electronic device. The system includes a device core, and a test access port (TAP) connected to the device core, the TAP including a Test Data Input (TDI) pin, a Test Mode Select (TMS) pin, a Test Reset (TRST) pin, a Test Clock (TCK) pin, and a Test Data Output (TDO) pin. A reset controller is connected to the TRST pin, the reset controller including a Test Configuration Register (TCR) configured to hold a logic one or a logic zero, the TCR outputting a scan mode signal to indicate scan test mode or functional mod. The reset controller also includes a first flip-flop having a data input receiving the scan mode signal, a data output, and a reset input receiving a power-on reset (POR) signal, the first flip-flop being clocked by a TCK signal received at the TCK pin. The reset controller further includes a NOR gate having inputs connected to the TMS and TDI pins and an output, and an AND gate having inputs connected to the output of the first flip-flop and the output of the NOR gate, and an output. The reset controller additionally includes a second flip-flop having a data input receiving the output of the AND gate, a data output, and a reset input receiving the POR signal, the second flip-flop being clocked by the TCK signal, and an OR gate having inputs connected to the output of the second flip-flop and the POR signal, and an output generating a TCR reset signal to reset the TCR, the TCR reset signal also being provided to the TRST pin of the TAP.

The TCR may be a single bit flip-flop having a data input receiving a logic signal at a first logic level when the system is in the functional mode and at a second logic level when the system is in the scan test mode, a data output connected to provide the scan mode signal to the data input of the first flip-flop, and a reset input receiving the TCR reset signal.

During scan mode, a scan in (SI) signal may be multiplexed on the TDI pin, a scan enable (SE) signal is multiplexed on the TMS pin and a shift clock pin is multiplexed on the TCK pin.

The reset controller may enable user-controlled entry into and exit from the scan test mode without a power cycle of the electronic device or without an additional pin through the TCR reset signal resetting the TCR during a capture-phase of the scan test mode.

Also disclosed herein is a method for testing a device using a JTAG test access port (TAP) connected to the device, the method including asserting a scan enable signal for device entry into a shift-phase of scan mode, performing a shift-phase of a scan test, deasserting the scan enable signal to enter a capture-phase of the scan mode, performing the capture-phase of the scan test; and exiting the scan mode during the capture-phase by deasserting the scan enable signal and a scan in signal, causing a TCR reset signal assertion to reset a test control register (TCR), wherein reset of the TCR causes the exiting of the scan mode.

The method may include, prior to asserting the scan mode, performing a power-on reset of the device to thereby reset a reset circuit generating the TCR reset signal and reset the TCR.

The TCR reset signal assertion may be caused, at least in part, by performing a logical NOR operation between the scan enable signal and the scan in signal once the scan enable signal and the scan in signal have been deasserted.

BRIEF DESCRIPTION OF THE DRAWINGS

FIG. 3 is a timing diagram showing the active high power-on reset signal POR, scan mode signal SCAN_MODE, scan enable signal SE, scan input signal SI, test clock signal TCK, and reset signal RESET_TCR operation during a power-on reset, entry into scan testing mode, operating in the shift phase, operation in the capture phase, and exit from scan testing.

FIG. 4 is a block diagram of the reset controller of FIG. 2 when the device is in functional mode with values of different pins shown in brackets.

FIG. 5 is a block diagram of the reset controller of FIG. 2 when the device is in the shift phase of scan testing mode with values of different pins shown in brackets.

FIG. 6 is a block diagram of the reset controller of FIG. 2 when the device is in the capture phase of scan testing mode with values of different pins shown in brackets.

FIG. 7 is a block diagram of the JTAG TAP, device core, and reset controller of FIG. 2 when exiting scan testing mode with values of different pins shown in brackets.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Figure 1:
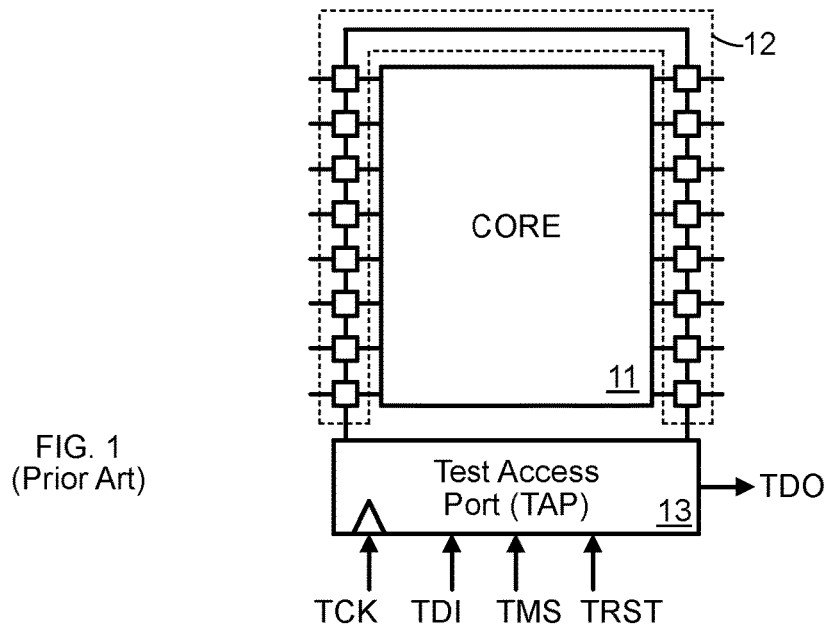
FIG. 1 is a block diagram of a JTAG Test Access Port (TAP) connected in a configuration to perform testing on a device core.
Figure 2:
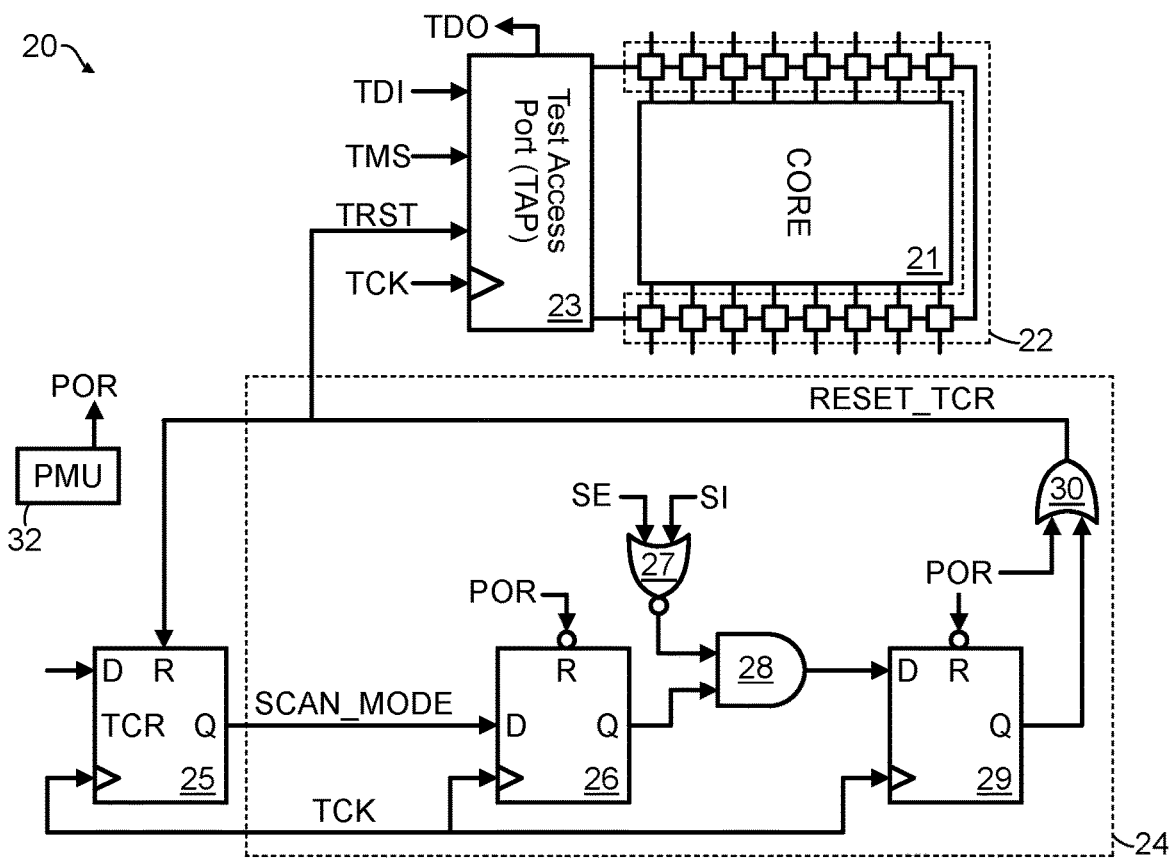
FIG. 2 is a block diagram of a JTAG TAP connected to perform scan testing on a device core in response to programming of a test control register (TCR), and a reset controller permitting reset of the TCR during scan testing to cause exit of scan mode.

Now described with reference to FIG. 2 is a system 20 including a device core 21 with a test access port (TAP) 23 connected thereto. The TAP 23 includes a set of five pins as described in the IEEE 1149.1 standard. The pins are the Test Data Input (TDI) pin, Test Mode Select (TMS) pin, Test Reset (TRST) pin, Test Clock (TCK) pin, and Test Data Output (TDO) pin. IEEE 1149.1 mandates the 4 pins-TDI, TMS, TCK and TMS with TRST being an optional pin. A reset controller 24 provides its output to the TRST pin as input, while TDI, TMS, and TCK signals are received at the TDI, TMS, and TCK pins from a test tool connected to those pins. A scan in SI signal may be multiplexed on the TDI pin, and a scan enable SE signal may be multiplexed on the TMS pin and the shift clock may be multiplexed on the TCK pin.

To perform a scan test, after connecting the test tool to the TAP 23, a single bit Test Configuration Register (TCR) 25, such as a flip flop, within the reset controller 24 is set to hold a logic one. To exit scan testing, the TCR 25 is reset to hold a logic zero. The output of the TCR 25 is a scan mode SCAN_MODE signal, which causes the TAP 23 and the scan flip flops within the core 11 to be placed into scan test mode when at a logic one and causes the TAP 23 and the scan flip flops within the core 11 to return to a functional mode arrangement when at a logic zero.

To perform scan testing therefore, the TCR 25 is set to a logic one, setting the scan flip flops be connected into a scan chain, and a test vector is loaded into the TDI pin and "shifted" through the scan chain by being clocked the test clock signal TCK. The test pattern is applied to the device core 21 and the response is "captured" by the scan chain. Then, using the test clock signal TCK again, the captured response is serially shifted out through the TDO pin. This captured response is then compared to the expected response to determine whether the device 21 is functioning correctly. Note that during scan testing, the sequential logic cells of a TAP controller within the TAP 23 are connected as part of the scan chain and therefore the test vector is shifted through these sequential logic cells to test the TAP controller as well.

This disclosure concerns the exit from scan testing by resetting the TCR 25 to hold a logic zero. The circuitry to enable this functionality is contained within the reset controller 24. First, the circuit arrangement of the reset controller 24 itself will be described and thereafter the operation of the reset controller 24 will be described.

The reset controller 24 includes a first flip flop 26 having a D input receiving the SCAN_MODE signal from the TCR 25, a Q output providing output to AND gate 28, a reset input R receiving a power-on reset signal POR (for example from a power management unit 32) and being clocked by a shift clock signal TCK. The AND gate 28, as stated, receives the output from the flip-flop 25 as well as the output of NOR gate 27, performs a logical AND operation thereupon, and provides its output to the D input of a second flip flop 29. The NOR gate 27 has its inputs connected to the TMS and TDI pins, performs a logical NOR operation on the signals received therefrom, and as stated provides its output to an input of the AND gate 28.

The second flip-flop 29 has a D input receiving the output of AND gate 28, a Q output providing output to OR gate 30, a reset input R receiving the power-on reset signal POR and is clocked by the clock signal TCK. The OR gate 30, as stated, receives input from the output of the flip-flop 29, receives the POR signal as input, performs a logical OR operation thereon, and generates the RESET_TCR signal as its output. The RESET_TCR signal serves to reset the TCR 25 when asserted and is provided to the TRST pin of the TAP 23 for providing the TAP 23 with the functionality ascribed to the TRST pin and signal pursuant to the JTAG standard.

Operation of the system 20 will now be described with reference to the timing diagram of FIG. 3. First, a power-on reset is described. As shown in FIG. 3, between times T0 and T1, the system 20 is performing a power-on reset. As a result of the power-on reset POR signal being at a logic one, the flip flops 26 and 29 are reset. As a result of the OR gate 30 receiving the logic one from POR, the reset signal RESET_TCR is asserted to a logic one. Therefore, during the power-on reset, the TCR 25 is reset by assertion of RESET_TCR and, in turn, the scan mode signal SCAN_MODE is deasserted to a logic zero. Since the power-on reset signal POR is at a logic one during the power-on reset, the output of the AND gate 28 has no effect on the logic level of RESET_TCR, so the values on the TMS and TDI pins (e.g., SE and SI) are considered to be "don't care", as shown in FIG. 3. The power-on reset is completed at time T1 as indicated in FIG. 3 by the power-on reset POR signal dropping to a logic zero.

At time T1, functional mode begins and will now be described with additional reference to FIG. 4. When the POR signal is deasserted to a logic zero at time T1, the inputs to the OR gate 30 will be at a logic zero and as such, the reset signal RESET_TCR falls to a logic zero at time T1, permitting setting of the test control register TCR 25 later on to enter scan mode. At this point however, the input to the TCR 25 remains a logic zero, so the scan mode signal SCAN_MODE remains at a logic zero, maintaining the system 20 in functional mode. Since the scan mode signal SCAN_MODE is at a logic zero, when the first pulse of the shift clock TCK during functional mode arrives, the output of the first flip flop 26 remains at a logic low, in turn causing the output of AND gate 28 remain at a logic zero and therefore causing the output of the second flip flop 29 to remain at a logic zero. Since the POR signal is at a logic zero, the OR gate 30 maintains the reset signal RESET_TCR at a logic zero. At time T2, the signal on the TMS pin (e.g., the scan enable signal SE) is asserted, although due to the input to the TCR 25 being a logic zero, the scan mode signal SCAN_MODE remains at a zero.

Functional mode ends at time T3 when the TCR 25 receives a logic one at its input and is clocked so that the scan mode signal SCAN_MODE is asserted to a logic one. This enters scan mode, which is now described with further reference to FIG. 5 (shift phase) and FIG. 6 (capture phase). Since the value on the TMS pin is already at a logic one at time T3, entry into scan mode is entry into the shift phase.

This does not perturb the logic value of the reset signal RESET_TCR since the logic value on the TMS pin (e.g., scan enable SE) is at a logic one, causing the output of NOR gate 27 to remain at a logic zero, in turn causing the output of the AND gate 28 to remain at a logic zero, in turn causing the output of the second flip flop 29 remain at a logic zero when the shift clock TCK pulse arrives at time T3. Since the power-on reset POR signal is at a logic zero, the value of the reset signal RESET_TCR remains at a logic zero at the output of the OR gate 30. Since the logic value on the TDI pin (e.g., scan in SI) remains controllable by the test tool (and not the user) at this point, the shift phase controllability requirements for scan input channels for scan test mode are maintained.

The shift phase ends at time T4 when the scan enable signal SE is deasserted to a logic zero, indicating entry into the capture phase. The capture phase is now described. At time T4, the signal on the TDI pin (e.g., the scan in signal SI) is asserted to a logic one before the scan clock TCK is pulsed, causing the output of the NOR gate 27 to be maintained at a logic zero, ultimately resulting in the reset signal RESET_TCR being maintained at a logic zero while the scan clock TCK is pulsed later one or more times to facilitate capture.

At time T5, the capture phase ends when the scan enable signal SE is asserted to a logic one, switching back to the shift phase, with shift phase proceeding between times T5 and T6 as described above to shift out the data captured during the capture phase (and shift in a new test vector).

Exit from scan mode will now be discussed with additional reference to FIG. 7. At time T6, the TMS pin (e.g., scan enable signal SE) is forced back to a logic zero, re-entering the capture phase. Since the TDI pin (e.g., scan in signal SI) can be user controlled during the capture phase, to exit scan mode, the TDI pin (e.g., scan in signal SI) is forced to a logic zero at time T6. As a result of both SI and SE being at a logic zero, the output of the NOR gate 27 is asserted to a logic one. Since the output of the first flip flop 26 is at a logic one during scan mode, the output of the AND gate 28 is asserted to a logic one. Therefore, when the next pulse of the shift clock TCK arrives at time T7, the second flip flop 29 passes the logic out from the output of the AND gate 28 as its output, resulting in the OR gate 30 asserting the reset signal RESET_TCR to a logic one to thereby reset the TCR 25. This resets the scan mode signal SCAN_MODE to a logic zero at time T7, causing exit from scan mode.

With scan mode having been exited, functional mode is re-entered, and registers within the TAP 23 can be reprogrammed to provide for different types of testing. Scan mode may then be re-entered by setting the TCR 25 to a logic one again.

The above-described design allows for user-controlled entry into and exit from scan mode without having to power cycle the device. This feature promotes device reliability and saves time during testing. Furthermore, this design does not require an additional pin for exiting scan mode, which saves device area and tester/ATE channels. In cases where an extra pin is not utilized, this also increases tester parallelism. Additionally, since the design does not require an additional pin, the option to use an extra pin as an additional scan input or output channel to enhance scan controllability and observability is available if desired.

Modifications and variations can be made to what has been described and illustrated herein without departing from the scope of this disclosure.

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. A system, comprising:
    a device core and scan flip flops associated with said device core;
    a test access port (TAP) coupled to the scan flip flops, the TAP having a test clock (TCK) pin configured to receive a test clock (TCK) signal that clocks the TAP, a test data in (TDI) pin configured to receive a test data in (TDI) signal, and a test mode select (TMS) pin configured to receive a test mode select (TMS) signal;
    a test control register (TCR) associated with the TAP;
    wherein the TAP, in response to setting of the TCR to assert a scan mode signal, configures the scan flip flops for a scan testing and performs the scan testing on the device core;
    wherein the TAP, in response to resetting of the TCR to deassert the scan mode signal, exits the scan testing; and
    a reset circuit configured to reset the TCR in response to deassertion of both a scan enable (SE) signal applied to the TMS pin and a scan input (SI) signal applied to the TDI pin during a capture-phase of scan testing.

2. The system of claim 1, wherein the reset circuit is further configured to reset the TCR by asserting a TCR reset signal; and wherein the TAP includes a test reset (TRST) pin coupled to receive the TCR reset signal, with the TAP being further configured to reset based upon assertion of the TCR reset signal.

3. The system of claim 1, wherein the reset circuit comprises:
    a first flip flop having a data input coupled to receive the scan mode signal, a reset input coupled to receive a power-on reset signal, and an output;
    a first logic circuit configured to generate a first logic output based upon the SE signal, the SI signal, and the output of the first flip flop;
    a second flip flop having a data input coupled to receive the first logic output, a reset input coupled to receive the power-on reset signal, and an output; and
    a second logic circuit configured to cause reset of the TCR based upon the output of the second flip flop and the power-on reset signal.

4. The system of claim 3, wherein the first logic circuit comprises:
    a NOR gate having inputs coupled to receive the SE signal and SI signal as input; and an AND gate having inputs coupled to receive an output of the NOR gate and the output of the first flip flop.

5. The system of claim 4, wherein the second logic circuit comprises an OR gate having inputs coupled to receive the output of the second flip flop and the power-on reset signal, the OR gate configured to generate a TCR reset signal based upon a logical OR operation between its inputs, the OR gate having an output coupled to a reset input of the TCR.

6. The system of claim 5, wherein the TAP includes a test reset (TRST) pin coupled to receive the TCR reset signal from the OR gate, with the TAP being further configured to reset in response to assertion of the TCR reset signal.

7. A method of testing a device using a joint test action group (JTAG) test access port (TAP) connected to the device, the method comprising:
performing a power-on-reset of the device by asserting a power-on reset (POR) signal provided to the TAP;
resetting a reset circuit in response to assertion of the POR signal;
resetting a test control register (TCR) in response to assertion of the POR signal;
exiting power-on-reset by deasserting the POR signal;
setting the TCR to assert a scan mode signal in response to exit of the power-on-reset;
asserting a scan enable signal connected to the TAP to cause entry of the device into a shift-phase of a scan mode;
performing the shift-phase of a scan test in the scan mode;
deasserting the scan enable signal and asserting a scan in signal to exit the shift-phase of the scan mode and enter a capture-phase of the scan mode;
pulsing a shift clock and performing the capture-phase of the scan test in the scan mode;
exiting the scan mode by deasserting the scan enable signal and a scan in signal and pulsing the shift clock to thereby cause assertion of a TCR reset signal; and
resetting the TCR in response to assertion of the TCR reset signal.

8. The method of claim 7, wherein the assertion of the TCR reset signal is caused in response to deassertion of the scan enable signal and the scan in signal by:
clocking a first flip flop receiving the scan mode signal;
performing a logical NOR operation between the scan enable signal and the scan in signal;
performing a logical AND operation between an output of the first flip flop and a result of the logical NOR operation;
clocking a second flip flop receiving a result of the logical AND operation; and
performing a logical OR operation between the POR signal and an output of the second flip flop;
when a result of the logical OR operation is the TCR reset signal.

9. An electronic device, comprising:
a device core and scan flip flops associated with said device core;
a test access port (TAP) coupled to the scan flip flops, the TAP having a test clock (TCK) pin configured to receive a test clock (TCK) signal that clocks the TAP, a test data in (TDI) pin configured to receive a test data in (TDI) signal, a test mode select (TMS) pin configured to receive a test mode select (TMS) signal;
a test control register (TCR) associated with the TAP, the TCR having a data input, a reset input configured to receive a TCR reset signal, and a data output;
a first flip flop having a data input connected to the data output of the TCR, a reset input configured to receive a power-on reset (POR) signal, and a data output;
a first logic circuit generating a first logic output based upon signals at the TMS and TDI pins and the data output of the first flip flop;
a second flip flop having a data input coupled to receive the first logic output, a reset input coupled to receive the POR signal, and a data output; and
a second logic circuit configured to assert the TCR reset signal based upon a logical OR operation performed on the data output of the second flip flop.

10. The electronic device of claim 9, wherein the first logic circuit comprises:
a NOR gate having its inputs connected to the TMS and TDI pins; and
an AND gate having its inputs connected to an output of the NOR gate and the data output of the first flip flop, wherein the first logic output is generated at an output of the AND gate.

11. The electronic device of claim 9, wherein the second logic circuit comprises an OR gate having its input connected to the data output of the second flip flop and the POR signal, wherein the TCR reset signal is generated at an output of the OR gate.

12. The electronic device of claim 9, wherein the TAP includes test reset (TRST) pin coupled to receive the TCR reset signal, with the TAP being further configured to reset based upon assertion of the TCR reset signal.

13. A system for testing an electronic device, the system comprising:
a device core;
a test access port (TAP) connected to the device core, the TAP including a Test Data Input (TDI) pin, a Test Mode Select (TMS) pin, a Test Reset (TRST) pin, a Test Clock (TCK) pin, and a Test Data Output (TDO) pin;
a reset controller connected to the TRST pin, the reset controller comprising:
a Test Configuration Register (TCR) configured to hold a logic one or a logic zero and configured to output a scan mode signal to indicate scan test mode or functional mode;
a first flip-flop having a data input configured to receive the scan mode signal, a data output, and a reset input configured to receive a power-on reset (POR) signal, the first flip-flop being clocked by a TCK signal received at the TCK pin;
a NOR gate having inputs connected to the TMS and TDI pins and an output;
an AND gate having inputs connected to the output of the first flip-flop and the output of the NOR gate, and an output;
a second flip-flop having a data input configured to receive the output of the AND gate, a data output, and a reset input configured to receive the POR signal, the second flip-flop being clocked by the TCK signal; and
an OR gate having inputs connected to the output of the second flip-flop and the POR signal, and an output configured to generate a TCR reset signal to reset the TCR, the TCR reset signal also being provided to the TRST pin of the TAP.

14. The system of claim 13, wherein the TCR comprises a single bit flip-flop having a data input configured to receive a logic signal at a first logic level when the system is in the functional mode and at a second logic level when the system is in the scan test mode, a data output connected to provide the scan mode signal to the data input of the first flip-flop, and a reset input configured to receive the TCR reset signal.

15. The system of claim 13, wherein, during scan mode, a scan in (SI) signal is multiplexed on the TDI pin, a scan enable (SE) signal is multiplexed on the TMS pin and a shift clock signal is multiplexed on the TCK pin.

16. The system of claim 13, wherein the reset controller enables user-controlled entry into and exit from the scan test mode without a power cycle of the electronic device.

17. The system of claim 13, wherein the reset controller enables user-controlled entry into and exit from the scan test mode without an additional pin through the TCR reset signal resetting the TCR during a capture-phase of the scan test mode.

18. A method for testing a device using a joint test action group (JTAG) test access port (TAP) connected to the device, the method comprising:
   asserting a scan enable signal for device entry into a shift-phase of scan mode;
   performing a shift-phase of a scan test;
   deasserting the scan enable signal and asserting a scan in signal to enter a capture-phase of the scan mode;
   pulsing a shift clock and performing the capture-phase of the scan test; and
   exiting the scan mode during the capture-phase by deasserting the scan enable signal and a scan in signal, causing a TCR reset signal assertion to reset a test control register (TCR), wherein reset of the TCR causes the exiting of the scan mode.

19. The method of claim 18, further comprising, prior to asserting the scan enable signal, performing a power-on reset of the device to thereby reset a reset circuit generating the TCR reset signal and reset the TCR.

20. The method of claim 18, wherein the TCR reset signal assertion is caused, at least in part, by performing a logical NOR operation between the scan enable signal and the scan in signal once the scan enable signal and the scan in signal have been deasserted.

* * * * *